(12) United States Patent
Aoyagi (10) Patent No.: US 8,587,015 B2
(45) Date of Patent: Nov. 19, 2013

(54) LIGHT-EMITTING ELEMENT

(75) Inventor: Hidekazu Aoyagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/685,340

(22) Filed: Jan. 11, 2010

(65) Prior Publication Data

US 2011/0140159 A1    Jun. 16, 2011

(30) Foreign Application Priority Data

Jan. 22, 2009  (JP) ................ P2009-011692

(51) Int. Cl.
*H01L 33/44* (2010.01)
(52) U.S. Cl.
USPC ............ 257/99; 257/81; 257/96; 257/98; 257/E33.012; 438/89; 438/545
(58) Field of Classification Search
USPC ........ 257/96, 98, 99, 102, E33.012; 438/89, 438/545
See application file for complete search history.

(56) References Cited

U.S. PATENT DOCUMENTS

| | | | | |
|---|---|---|---|---|
| 5,048,035 A * | 9/1991 | Sugawara et al. | ......... | 372/45.01 |
| 5,541,751 A * | 7/1996 | Sumida et al. | ......... | 349/116 |
| 5,814,839 A * | 9/1998 | Hosoba | ......... | 257/96 |
| 5,977,565 A * | 11/1999 | Ishikawa et al. | ......... | 257/81 |
| 6,133,588 A * | 10/2000 | Ogihara et al. | ......... | 257/88 |
| 6,180,961 B1 * | 1/2001 | Ogihara et al. | ......... | 257/94 |
| 6,580,736 B1 * | 6/2003 | Yoshie et al. | ......... | 372/45.01 |
| 7,034,340 B2 * | 4/2006 | Yukimoto | ......... | 257/88 |
| 7,210,819 B2 * | 5/2007 | Jiang et al. | ......... | 362/249.02 |
| 7,271,421 B2 * | 9/2007 | Yukimoto et al. | ......... | 257/92 |
| 7,700,960 B2 * | 4/2010 | Kim et al. | ......... | 257/88 |
| 7,709,849 B1 * | 5/2010 | Kal et al. | ......... | 257/96 |
| 2007/0246716 A1 * | 10/2007 | Bhat et al. | ......... | 257/81 |
| 2007/0284598 A1 * | 12/2007 | Shakuda et al. | ......... | 257/93 |
| 2008/0128721 A1 | 6/2008 | Watanabe et al. | | |
| 2008/0185606 A1 * | 8/2008 | Sano et al. | ......... | 257/98 |
| 2009/0072249 A1 * | 3/2009 | Fudeta | ......... | 257/88 |

FOREIGN PATENT DOCUMENTS

JP         4172515        8/2008

* cited by examiner

*Primary Examiner* — William F Kraig
*Assistant Examiner* — Sheng Zhu
(74) *Attorney, Agent, or Firm* — K&L Gates LLP (57) ABSTRACT

Disclosed herein is a light-emitting element including: a first conductivity type semiconductor layer; a light-emitting functional layer formed on the first conductivity type semiconductor layer; a second conductivity type semiconductor layer formed on the light-emitting functional layer; a first conductivity type electrode which has continuity with the exposed portion of the first conductivity type semiconductor layer; a second conductivity type electrode which has continuity with the second conductivity type semiconductor layer; an insulating layer which lies between the light-emitting functional layer, second conductivity type semiconductor layer and second conductivity type electrode on one part and the first conductivity type electrode on the other part; and an annex insulating layer annexed to the insulating layer to form a virtual diode having rectifying action in the opposite direction to that of a diode made up of the second conductivity type semiconductor layer, light-emitting functional layer and first conductivity type semiconductor layer.

15 Claims, 7 Drawing Sheets

LIGHT-EMITTING ELEMENT

CROSS REFERENCES TO RELATED APPLICATIONS

The present application claims priority to Japanese Priority Patent Application JP 2009-011692 filed in the Japan Patent Office on Jan. 22, 2009, the entire content of which is hereby incorporated by reference.

BACKGROUND

The present application relates to a light-emitting element.

Figure 7:
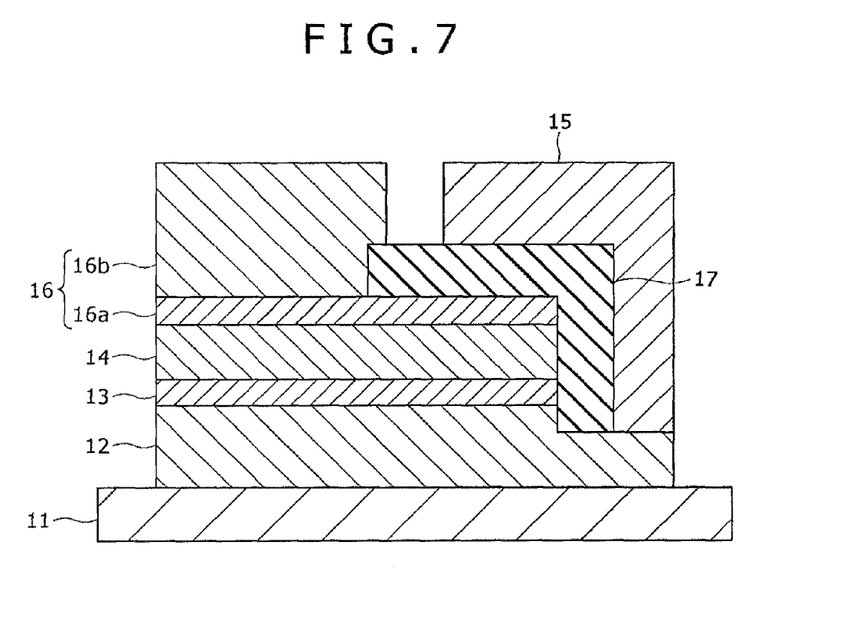
FIG. 7 is a side sectional view diagrammatically illustrating the rough configuration of a light-emitting diode which is an example of a light-emitting element.

FIG. 7 is a side sectional view diagrammatically illustrating the rough configuration of a light-emitting diode which is an example of a light-emitting element. This example shows a configuration example of a substrate-side light extraction light-emitting diode.

The light-emitting diode illustrated in FIG. 7 includes a laminated body on a substrate 11 made of a transparent material. The laminated body includes a semiconductor layer 12 and light-emitting functional layer 13 of a first conductivity type (e.g., n type) and a semiconductor layer 14 of a second conductivity type (e.g., p type). This laminated body provides a structure called a p-n junction using semiconductors.

It should be noted, however, that the first conductivity type semiconductor layer 12 is partially exposed rather than being entirely covered by the light-emitting functional layer 13 and second conductivity type semiconductor layer 14. A first conductivity type electrode 15 has continuity with the exposed portion. The first conductivity type electrode 15 functions as a cathode.

On the other hand, a second conductivity type electrode 16 is formed on the second conductivity type semiconductor layer 14 and has continuity with the same layer 14. The second conductivity type electrode 16 includes a second conductivity type first electrode 16a and a second conductivity type second electrode 16b. The second conductivity type first electrode 16a is capable of functioning as an optical reflecting film. The second conductivity type second electrode 16b is capable of functioning as a contact portion for bump interconnection. The second conductivity type electrode 16, made up of the two electrodes 16a and 16b laminated one on top of the other, functions as an anode.

In the light-emitting diode configured as described above, the portion having the p-n junction structure emits light when a forward voltage is applied from the second conductivity type electrode 16 serving as an anode to the first conductivity type electrode 15 serving as a cathode. That is, the quantum well structure of the light-emitting functional layer 13 is excited by the injection of a current, causing the entire surface of the laminated body including the light-emitting functional layer 13 to emit light.

Incidentally, increasing the lamination area of the light-emitting functional layer 13 is an effective approach for providing more brightness (enhancing the intensity) of light extracted from the light emitting diode. That is, it is effective to increase the area of the light-emitting functional layer 13 covering the first conductivity type semiconductor layer 12 and reduce the area of the exposed portion not covered by the same layer 13.

In the meantime, as for the first conductivity type electrode 15 which has continuity with the exposed portion of the first conductivity type semiconductor layer 12, at least a given area of the same electrode 15 must be exposed outward for bump interconnection.

In order to achieve compatibility between these contradictory requirements, a proposal has been made suggesting that an insulating layer 17 should lie between the laminated body including the light-emitting functional layer 13 and the first conductivity type electrode 15 (refer, for example, to Japanese Patent No. 4172515). Thanks to the mediation of the insulating layer 17 and the overlapping of the first conductivity type electrode 15 on the same layer 17, such a configuration provides a bump interconnection area in the first conductivity type electrode 15 while achieving brightness as a result of increased area of the laminated body including the light-emitting functional layer 13.

SUMMARY

However, the above configuration has the following problems.

In the light-emitting diode having the insulating layer 17 lying therein, the ESD (electrostatic discharge) resistance is determined by the dielectric breakdown voltage of the insulating material making up the same layer 17. For example, if $SiO_2$ is used as an insulating material making up the insulating layer 17, the dielectric breakdown voltage of the insulating material is approximately 100 MV/cm. Therefore, the insulating layer 17 of about 500 nm in thickness provides a dielectric breakdown voltage of about 500 V. However, the ESD resistance required of a light-emitting diode is approximately 3 kV. That is, the dielectric breakdown voltage of 500 V or so is insufficient.

A possible solution to meet the ESD resistance of approximately 3 kV would be to thicken the insulating layer 17. However, thickening the same layer 17 may lead to a reduced area of the light-emitting functional layer 13, which will result in reduced light intensity. Thickening the same layer 17 may also lead to upsizing of the light-emitting diode as a whole. Therefore, this solution is not desirable.

In light of the foregoing, it is desirable to provide a light-emitting element which offers improved dielectric breakdown voltage for sufficient ESD resistance without entailing problems including reduced light intensity and upsizing of the element as a whole.

In order to achieve the above object, a light-emitting element according to an embodiment of the present invention includes a first conductivity type semiconductor layer, light-emitting functional layer, second conductivity type semiconductor layer, first conductivity type electrode, second conductivity type electrode, insulating layer and annex insulating layer. The light-emitting functional layer is formed on the first conductivity type semiconductor layer in such a manner that part of the first conductivity type semiconductor layer is exposed. The second conductivity type semiconductor layer is formed on the light-emitting functional layer. The first conductivity type electrode has continuity with the exposed portion of the first conductivity type semiconductor layer. The second conductivity type electrode has continuity with the second conductivity type semiconductor layer. The insulating layer lies between the light-emitting functional layer, second conductivity type semiconductor layer and second conductivity type electrode on one part and the first conductivity type electrode on the other part for purposes of insulation. The annex insulating layer is annexed to the insulating layer and forms a virtual diode having rectifying action in the opposite direction to that of a diode made up of the second conductivity type semiconductor layer, light-emitting functional layer and first conductivity type semiconductor layer.

In the light-emitting element configured as described above, a diode having a p-n junction structure is formed by the lamination of the second conductivity type semiconductor layer, light-emitting functional layer and first conductivity type semiconductor layer. Aside from the above diode, a virtual diode is formed by annexing the annex insulating layer to the insulating layer. The virtual diode has rectifying action in the opposite direction. Therefore, when the diode having a p-n junction is forward-biased, the virtual diode in the insulating layer is reverse-biased. That is, current flow is difficult to take place in the insulating layer if the insulating layer is placed in a reverse bias condition established as a result of the annexing of the annex insulating layer. This provides improved dielectric breakdown voltage of the insulating layer without thickening the same layer.

The present application ensures improved dielectric breakdown voltage of the insulating layer, thus providing a light-emitting element with excellent ESD resistance. Further, even in that case, it is not necessary to increase the thickness of the insulating layer, thus avoiding problems such as reduced area of the light-emitting functional layer, which will lead to reduced light intensity, and upsizing of the element as a whole. The present invention permits easy downsizing of the element as a whole than the related-art structure for the same dielectric breakdown voltage, thus holding promise for improved productivity. Still further, a sufficient electrode area can be secured for bump interconnection without sacrificing the light brightness. On the other hand, if a circuit is formed by connecting the reverse p-n junction structure of the insulating layer to the p-n junction structure of the light-emitting element, the circuit can function as an ESD protection element.

Additional features and advantages are described herein, and will be apparent from the following Detailed Description and the figures.

DETAILED DESCRIPTION

The present application will be described below with reference to the accompanying drawings according to an embodiment.

It should be noted that the description will be made taking, as an example of a light-emitting element, a light-emitting diode (hereinafter referred to as an LED).

First Embodiment

First, a first embodiment of the LED to which the present invention is applied will be described.

[Rough Configuration of the Light-Emitting Element]

Figure 1:
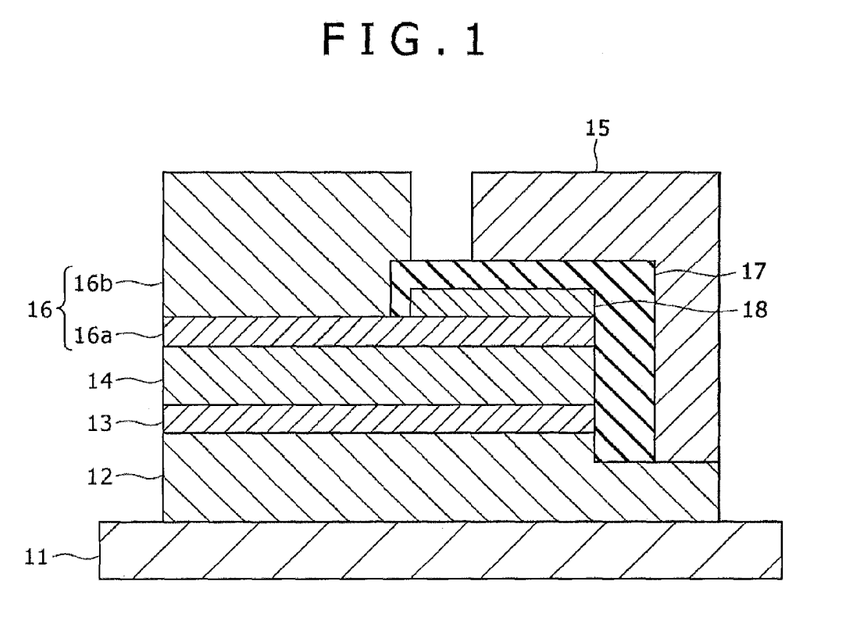
FIG. 1 is a side sectional view diagrammatically illustrating the rough configuration of an LED according to a first embodiment.

FIG. 1 is a side sectional view diagrammatically illustrating the rough configuration of an LED according to the first embodiment. This example shows a configuration example of a substrate-side light extraction light-emitting diode. In FIG. 1, on the other hand, like components as those in the configuration in related art (FIG. 7) are denoted by the same reference symbols.

The LED shown in FIG. 1 includes the substrate 11, first conductivity type semiconductor layer 12, light-emitting functional layer 13, second conductivity type semiconductor layer 14, first conductivity type electrode 15, second conductivity type electrode 16, insulating layer 17 and a first conductivity type semiconductor insulating layer 18.

It should be noted that the terms "first conductivity type" and "second conductivity type" here refer to the conductivity types different from each other. For example, if the first conductivity type is n type, the second conductivity type is p type. If the first conductivity type is p type, the second conductivity type is n type.

The substrate 11 serves as a base body for the LED and is made of a transparent member. A sapphire substrate, for example, may be used as the substrate 11. However, other types of substrates may also be used. Among types of substrates which can be used are GaAs, GaN, SiC, alumina, ZnS, ZnO, AlN, LiMgO, LiGaO$_2$, MgAl$_2$O$_4$, InP and Si substrates and any of these substrates with an underlying or buffer layer formed on the surface (main surface) thereof.

The first conductivity type semiconductor layer 12, light-emitting functional layer 13 and second conductivity type semiconductor layer 14 are laminated in this order on the substrate 11, thus forming a p-n junction structure using semiconductors. The quantum well structure of the light-emitting functional layer 13 is excited by the injection of a current, causing the entire surface of the laminated body including the light-emitting functional layer 13 to emit light.

Among materials used to form the first conductivity type semiconductor layer 12, light-emitting functional layer 13 and second conductivity type semiconductor layer 14 are GaN-based compound semiconductors (including AlGaN or AlInGaN and InGaN mixed crystals), and InN-based, AlN-based, AlGaInP-based, AlGaInAs-based, GaInAs-based, GaInAsP-based, GaP-based and InP-based compound semiconductors.

It should be noted, however, that the first conductivity type semiconductor layer 12 is partially exposed rather than being entirely covered by the light-emitting functional layer 13 and second conductivity type semiconductor layer 14. That is, the light-emitting functional layer 13 is formed on the first conductivity type semiconductor layer 12 in such a manner that part of the same layer 12 is exposed. The second conductivity type semiconductor layer 14 is formed to entirely cover the light-emitting functional layer 13.

The first conductivity type electrode 15 is formed so that the same electrode 15 has continuity with the exposed portion of the first conductivity type semiconductor layer 12 and that the upper end surface of the same electrode 15 functions as a contact portion for bump interconnection. Because of continuity with the first conductivity type semiconductor layer 12, the first conductivity type electrode 15 functions as a cathode.

Among materials used to form the first conductivity type electrode 15 are titanium (Ti), titanium alloys such as TiW and TiMo (e.g., TiW layer, Ti layer/Ni layer/Au layer), aluminum and aluminum alloys. It should be noted that the layers preceding "/" are closer to the base body (that is, located more downward).

The second conductivity type electrode 16 is formed so that the same electrode 16 has continuity with the second conductivity type semiconductor layer 14 and that the upper end surface of the same electrode 16 functions as a contact portion for bump interconnection. More specifically, the second conductivity type electrode 16 includes the two electrodes 16a and 16b laminated one on top of the other. The second conductivity type first electrode 16a is capable of functioning as an optical reflecting film. The second conductivity type second electrode 16b is capable of functioning as a contact portion for bump interconnection. The second conductivity type electrode 16, made up of the two electrodes 16a and 16b laminated one on top of the other, functions as an anode.

Among materials used to form the second conductivity type first electrode 16a is silver (Ag). If made of Ag, the same electrode 16a provides an optical reflectance of 96% or higher.

On the other hand, the same materials as for the first conductivity type electrode 15 may be used as the second conductivity type second electrode 16b.

The insulating layer 17 is disposed to lie between the laminated body including the light-emitting functional layer 13 (more specifically, laminated body made up of the light-emitting functional layer 13, second conductivity type semiconductor layer 14 and second conductivity type first electrode 16a) and the first conductivity type electrode 15 for purposes of insulation. Thanks to the mediation of the insulating layer 17, the first conductivity type electrode 15 overlaps the insulating layer 17. This overlapping provides a sufficient bump interconnection area on the upper end surface of the first conductivity type electrode 15.

Among materials used to form the insulating layer 17 are $SiO_2$, SiN and other insulating materials. In addition to the above, however, $SiO_x$-based, $SiN_y$-based and $SiO_xN_y$-based materials, and $Ta_2O_5$, $ZrO_2$, AlN and $Al_2O_3$ may also be used.

The first conductivity type semiconductor insulating layer 18 is annexed to the side of the insulating layer 17 facing the second conductivity type first electrode 16a. The term "annexed" here refers to being disposed to lie between the insulating layer 17 and second conductivity type first electrode 16a.

The first conductivity type semiconductor insulating layer 18 lies at least over the region where the upper surface of the second conductivity type first electrode 16a and the portion of the first conductivity type electrode 15 overlapping the insulating layer 17 two-dimensionally coincide with each other as illustrated in FIG. 1. However, this region is not limited to the above. The same layer 18 may be spread to lie over the region where the upper surface of the second conductivity type first electrode 16a and the insulating layer 17 two-dimensionally coincide with each other. The same layer 18 may also bend around the edge of the second conductivity type first electrode 16a so as to lie between the end faces of the second conductivity type first electrode 16a and second conductivity type semiconductor layer 14 and the insulating layer 17.

Among materials used to form the first conductivity type semiconductor insulating layer 18 are any one of Si, Ge and C, or a combination of any one of B, Al, Ga, In and Ti and any one of N, P, As, Sb and Bi, or a combination of either Zn or Cd and any one of O, S, Se and Te, all with a controlled conductivity type. Here, the term "controlled conductivity type" refers to selection of materials so as to provide the desired conductivity type. More specifically, the first conductivity type semiconductor insulating layer 18 is n-type doped, for example, if B, Al, Ga, In, Zn or Cd is used. On the other hand, the same layer 18 is p-type doped, for example, if N, P, As, Sb, O, S, Se or Te is used.

As a result of the mediation of the first conductivity type semiconductor insulating layer 18, the same layer 18 and insulating layer 17 form a virtual diode. That is, the first conductivity type semiconductor insulating layer 18 forms a virtual diode together with the insulating layer 17 using a reverse p-n junction or Schottky junction between the two layers. It should be noted that the virtual diode has rectifying action in the opposite direction to that of a diode which includes the laminated body made up of the first conductivity type semiconductor layer 12, light-emitting functional layer 13 and second conductivity type semiconductor layer 14.

[Manufacturing Steps of the Light-Emitting Element]

A description will be given next of the manufacturing steps of the LED configured as described above.

FIGS. 2A to 2D are side sectional views diagrammatically illustrating the manufacturing steps of the LED according to the first embodiment.

Figure 2A:
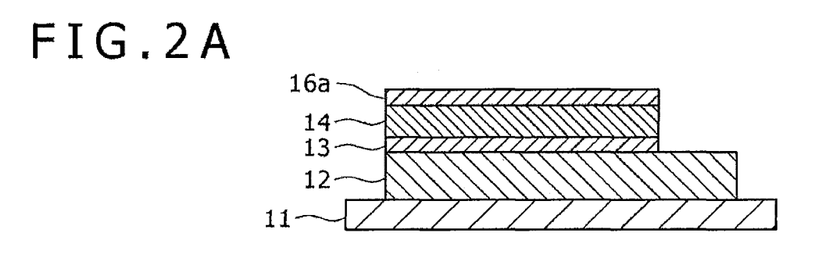
FIGS. 2A to 2D are side sectional views diagrammatically illustrating the manufacturing steps of the LED according to the first embodiment.

In order to manufacture the LED, the first conductivity type semiconductor layer 12, light-emitting functional layer 13, second conductivity type semiconductor layer 14 and second conductivity type first electrode 16a are formed in this order on the substrate 11 as illustrated in FIG. 2A. At this time, the first conductivity type semiconductor layer 12 is partially exposed.

Among methods used to form the first conductivity type semiconductor layer 12, light-emitting functional layer 13 and second conductivity type semiconductor layer 14 are metal-organic chemical vapor deposition (MOCVD), molecular beam epitaxy (MBE) and hydride vapor deposition in which halogen contributes to the transport or reaction. Among methods used to form the second conductivity type first electrode 16a are vacuum deposition, sputtering and other PVD (Physical Vapor Deposition) methods and a variety of CVD (Chemical Vapor Deposition) methods.

On the other hand, among methods used to partially expose the first conductivity type semiconductor layer 12 is a combination of lithography technique and wet etching or dry etching.

Figure 2B:
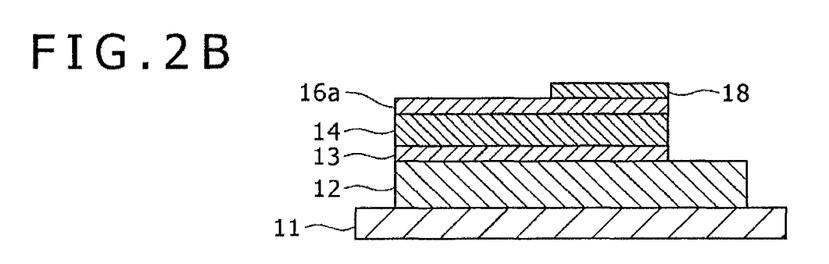

After the formation of the second conductivity type first electrode 16a, the first conductivity type semiconductor insulating layer 18 is formed on the predetermined partial region of the upper surface of the second conductivity type first electrode 16a as illustrated in FIG. 2B. Among methods used to form the same layer 18 are plasma CVD, sputtering, MOCVD and MBE.

Figure 2C:
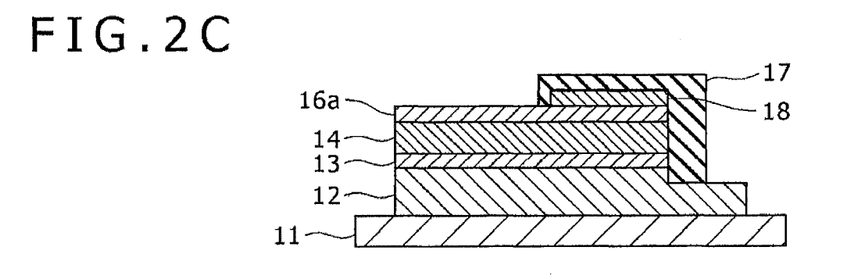

After the formation of the first conductivity type semiconductor insulating layer 18, the insulating layer 17 is formed to cover the first conductivity type semiconductor insulating layer 18 as illustrated in FIG. 2C so that the same layer 18 lies between the insulating layer 17 and second conductivity type first electrode 16a. Among methods used to form the insulating layer 17 are PVD methods such as vacuum deposition and sputtering and CVD methods.

Figure 2D:
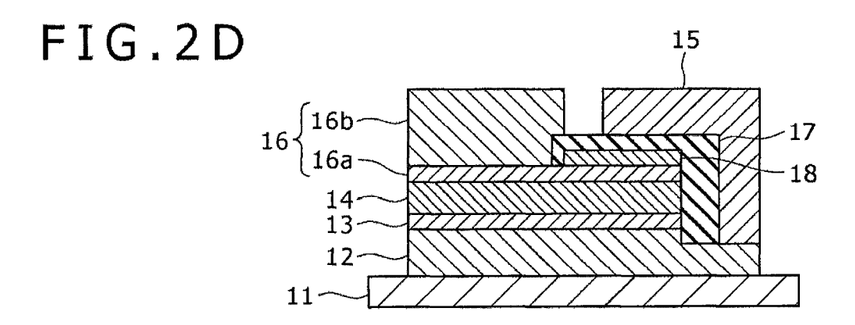

After the formation of the insulating layer 17, the second conductivity type second electrode 16b is formed on the portion of the second conductivity type first electrode 16a where the insulating layer 17 is not formed as illustrated in FIG. 2D. Among methods used to form the second conductivity type second electrode 16b are PVD methods such as vacuum deposition and sputtering, a variety of CVD methods and plating.

Further, the first conductivity type electrode 15 is formed in such a manner as to overlap the insulating layer 17 and have continuity with the exposed portion of the first conductivity type semiconductor layer 12. Among methods used to form the first conductivity type electrode 15 are PVD methods such as vacuum deposition and sputtering, a variety of CVD methods and plating.

It should be noted that either of the steps of partially exposing the first conductivity type semiconductor layer 12 and forming the second conductivity type second electrode 16b may be performed before the other. Alternatively, the two steps may be performed simultaneously.

The LED configured as shown in FIG. 1 is manufactured by the steps described above.

[Operation of the Light-Emitting Element]

A description will be given next of the operation adapted to cause the LED configured as described above to emit light.

In order to cause the LED configured as described above to emit light, a forward voltage is applied from the second conductivity type electrode 16 to the first conductivity type electrode 15. The second conductivity type electrode 16 has continuity with the second conductivity type semiconductor layer 14 and functions as an anode. The first conductivity type electrode 15 has continuity with the first conductivity type semiconductor layer 12 and functions as a cathode. This injects a current into the p-n junction structure formed by the laminated body which includes the first conductivity type semiconductor layer 12, light-emitting functional layer 13 and second conductivity type semiconductor layer 14. The quantum well structure of the light-emitting functional layer 13 is excited by the injection of a current, causing the entire surface of the laminated body including the light-emitting functional layer 13 to emit light.

It should be noted, however, that the first conductivity type semiconductor insulating layer 18 is annexed to the insulating layer 17. As a result of the annexing of the first conductivity type semiconductor insulating layer 18, a virtual diode is formed which has rectifying action in the opposite direction to that of the diode having a p-n junction structure formed by the laminated body. The laminated body includes the first conductivity type semiconductor layer 12, light-emitting functional layer 13 and second conductivity type semiconductor layer 14.

Therefore, when the diode having a p-n junction is forward-biased by applying a forward voltage from the anode to the cathode, the virtual diode which includes the insulating layer 17 and first conductivity type semiconductor insulating layer 18 is reverse-biased. That is, current flow is difficult to take place in the insulating layer 17 if a reverse bias condition is produced as a result of the annexing of the first conductivity type semiconductor insulating layer 18. This provides improved dielectric breakdown voltage of the insulating layer 17 without thickening the same layer 17.

Thus, the insulating layer 17 of the LED configured as described in the present embodiment offers improved dielectric breakdown voltage thanks to the annexing of the first conductivity type semiconductor insulating layer 18. Improved dielectric breakdown voltage provides an LED with excellent ESD resistance.

Moreover, even in that case, it is not necessary to increase the thickness of the insulating layer 17 because a reverse bias condition is used which is established as a result of the annexing of the first conductivity type semiconductor insulating layer 18. This avoids problems such as reduced area of the light-emitting functional layer 13, which will lead to reduced light intensity, and upsizing of the element as a whole. That is, the present invention permits easy downsizing of the element as a whole than the related-art structure for the same dielectric breakdown voltage, thus holding promise for improved productivity.

Still further, the first conductivity type electrode 15 overlaps the insulating layer 17 with improved dielectric breakdown voltage, thus providing a sufficient electrode area for bump interconnection without sacrificing the light brightness. On the other hand, if a circuit is formed by connecting the reverse p-n junction structure made up of the insulating layer 17 to the p-n junction structure formed by the laminated body which includes the first conductivity type semiconductor layer 12, light-emitting functional layer 13 and second conductivity type semiconductor layer 14, the circuit can function as an ESD protection element.

Moreover, in the LED configured as described in the present embodiment, the virtual diode adapted to provide improved dielectric breakdown voltage of the insulating layer 17 is formed by annexing the first conductivity type semiconductor insulating layer 18 to the insulating layer 17. That is, the virtual diode is formed by using the junction relationship between the insulating layer 17 and first conductivity type semiconductor insulating layer 18. This makes it possible to form the virtual diode by simply adding the first conductivity type semiconductor insulating layer 18 to the related-art configuration, thus keeping the complication of the LED configuration to a minimum.

Second Embodiment

A description will be given next of a second embodiment of the LED is applied. It should be noted that the differences between the present embodiment and the first embodiment described earlier will be mainly described here.

[Rough Configuration of the Light-Emitting Element]

Figure 3:
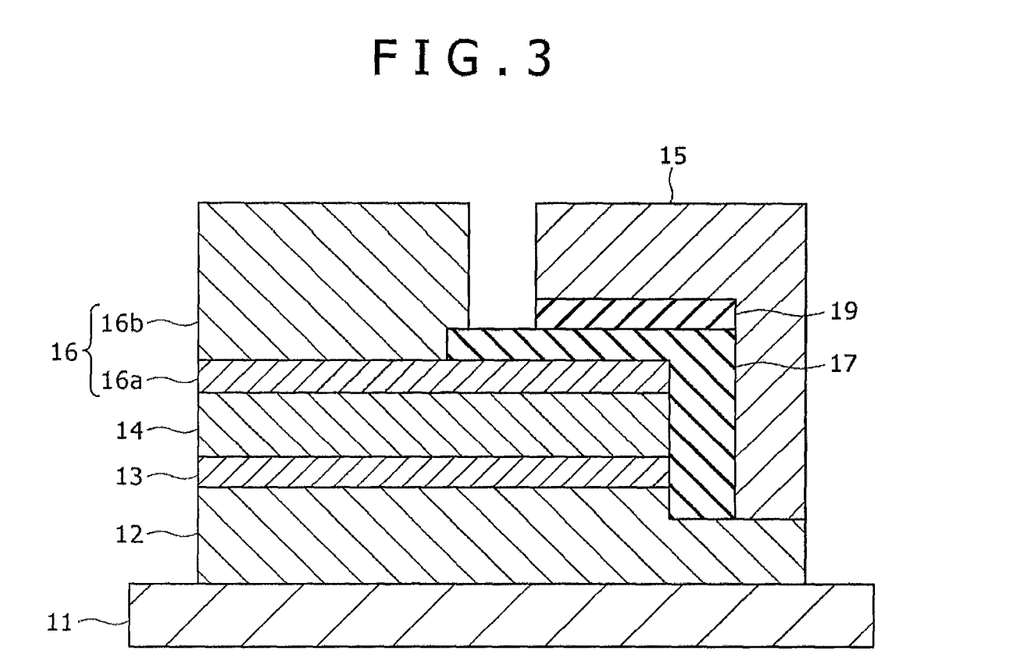
FIG. 3 is a side sectional view diagrammatically illustrating the rough configuration of the LED according to a second embodiment.

FIG. 3 is a side sectional view diagrammatically illustrating the rough configuration of the LED according to the second embodiment of the present invention.

The LED illustrated in this example differs from that according to the first embodiment in that it includes a second conductivity type semiconductor insulating layer 19 rather than the first conductivity type semiconductor insulating layer 18.

The second conductivity type semiconductor insulating layer 19 is annexed to the side of the insulating layer 17 facing the first conductivity type electrode 15. That is, the same layer 19 is disposed to lie between the insulating layer 17 and first conductivity type electrode 15.

The second conductivity type semiconductor insulating layer 19 lies at least over a region equivalent to the portion of the first conductivity type electrode 15 overlapping the insulating layer 17 as illustrated in FIG. 3. However, this region is not limited to the above. The same layer 19 may be spread to bend around the edge of the insulating layer 17 so as to lie across the boundary between the insulating layer 17 and first conductivity type electrode 15.

Among materials used to form the second conductivity type semiconductor insulating layer 19 are any one of Si, Ge and C, or a combination of any one of B, Al, Ga, In and Ti and any one of N, P, As, Sb and Bi, or a combination of either Zn or Cd and any one of O, S, Se and Te, all with a controlled conductivity type. Here, the term "controlled conductivity type" refers to selection of materials so as to provide the desired conductivity type. More specifically, the second conductivity type semiconductor insulating layer 19 is n-type doped, for example, if B, Al, Ga, In, Zn or Cd is used. On the other hand, the same layer 19 is p-type doped, for example, if N, P, As, Sb, O, S, Se or Te is used.

As a result of the mediation of the second conductivity type semiconductor insulating layer 19, the same layer 19 and insulating layer 17 form a virtual diode. That is, the second conductivity type semiconductor insulating layer 19 forms a virtual diode together with the insulating layer 17 using a reverse p-n junction or Schottky junction between the two layers. It should be noted that the virtual diode has rectifying action in the opposite direction to that of a diode which includes the laminated body made up of the first conductivity type semiconductor layer 12, light-emitting functional layer 13 and second conductivity type semiconductor layer 14.

[Manufacturing Steps of the Light-Emitting Element]

A description will be given next of the manufacturing steps of the LED configured as described above.

Figure 4A:
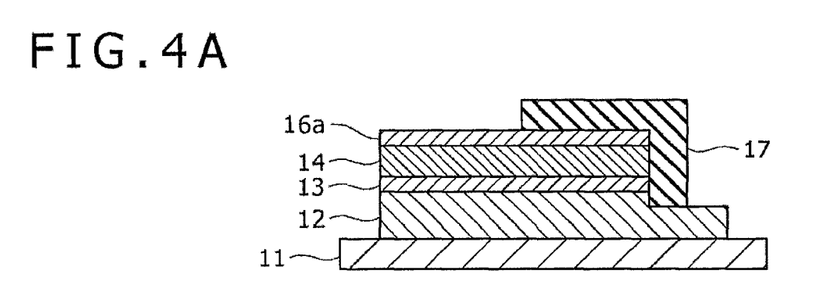
FIGS. 4A to 4C are side sectional views diagrammatically illustrating the manufacturing steps of the LED according to the second embodiment.
Figure 4B:
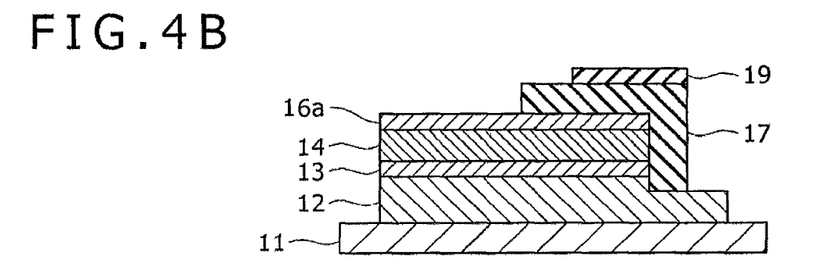
Figure 4C:
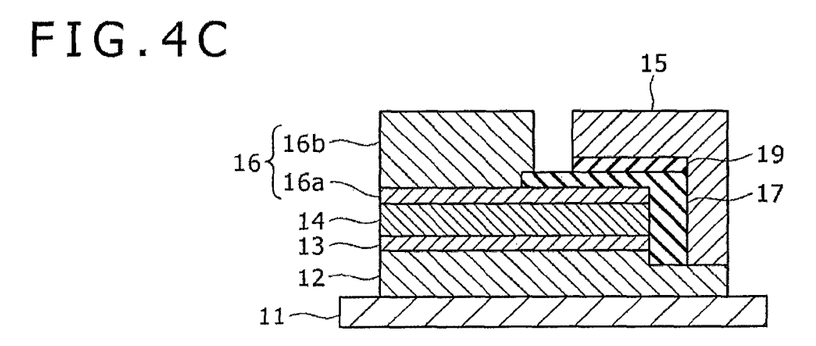

FIGS. 4A to 4C are side sectional views diagrammatically illustrating the manufacturing steps of the LED according to the second embodiment.

In order to manufacture the LED, the first conductivity type semiconductor layer 12, light-emitting functional layer 13, second conductivity type semiconductor layer 14 and second conductivity type first electrode 16a are formed in this order on the substrate 11 as illustrated in FIG. 4A. The manufacturing steps up to this point are exactly the same as those in the first embodiment.

After the formation of the second conductivity type first electrode 16a, the insulating layer 17 is formed to cover the predetermined partial region of the upper surface of the second conductivity type first electrode 16a and the predetermined partial region of the exposed portion of the first conductivity type semiconductor layer 12. The insulating layer 17 need only be formed in the same manner as in the first embodiment.

After the formation of the insulating layer 17, the second conductivity type semiconductor insulating layer 19 is formed on the predetermined partial region of the upper surface of the insulating layer 17 as illustrated in FIG. 4B. Among methods used to form the second conductivity type semiconductor insulating layer 19 are plasma CVD, sputtering, MOCVD and MBE.

After the formation of the second conductivity type semiconductor insulating layer 19, the second conductivity type second electrode 16b is formed on the region of the second conductivity type first electrode 16a where the insulating layer 17 is not formed as illustrated in FIG. 4C. The second conductivity type second electrode 16b need only be formed in the same manner as in the first embodiment.

Further, the first conductivity type electrode 15 is formed in such a manner as to not only overlap the second conductivity type semiconductor insulating layer 19 formed on top of the insulating layer 17 but also have continuity with the exposed portion of the first conductivity type semiconductor layer 12. The first conductivity type electrode 15 need only be formed in the same manner as in the first embodiment.

It should be noted that either of the steps of partially exposing the first conductivity type semiconductor layer 12 and forming the second conductivity type second electrode 16b may be performed before the other. Alternatively, the two steps may be performed simultaneously. Still alternatively, the second conductivity type second electrode 16b may be formed prior to forming the second conductivity type semiconductor insulating layer 19.

The LED configured as shown in FIG. 3 is manufactured by the steps described above.

[Operation of the Light-Emitting Element]

A description will be given next of the operation adapted to cause the LED configured as described above to emit light.

In order to cause the LED configured as described above to emit light, a forward voltage is applied from the second conductivity type electrode 16 to the first conductivity type electrode 15. The second conductivity type electrode 16 has continuity with the second conductivity type semiconductor layer 14 and functions as an anode. The first conductivity type electrode 15 has continuity with the first conductivity type semiconductor layer 12 and functions as a cathode. This injects a current into the p-n junction structure formed by the laminated body which includes the first conductivity type semiconductor layer 12, light-emitting functional layer 13 and second conductivity type semiconductor layer 14. The quantum well structure of the light-emitting functional layer 13 is excited by the injection of a current, causing the entire surface of the laminated body including the light-emitting functional layer 13 to emit light.

It should be noted, however, that the second conductivity type semiconductor insulating layer 19 is annexed to the insulating layer 17. As a result of the annexing of the second conductivity type semiconductor insulating layer 19, a virtual diode is formed which has rectifying action in the opposite direction to that of the diode having a p-n junction structure formed by the laminated body. The laminated body includes the first conductivity type semiconductor layer 12, light-emitting functional layer 13 and second conductivity type semiconductor layer 14.

Therefore, when the diode having a p-n junction is forward-biased by applying a forward voltage from the anode to the cathode, the virtual diode which includes the insulating layer 17 and second conductivity type semiconductor insulating layer 19 is reverse-biased. That is, current flow is difficult to take place in the insulating layer 17 if a reverse bias condition is produced as a result of the annexing of the second conductivity type semiconductor insulating layer 19. This provides improved dielectric breakdown voltage of the insulating layer 17 without thickening the same layer 17.

Thus, the LED configured as described in the present embodiment also offers excellent ESD resistance thanks to the dielectric breakdown voltage of the insulating layer 17. That is, sufficient ESD resistance can be secured without entailing problems including reduced light intensity and upsizing of the element as a whole as with the first embodiment.

Moreover, in the LED configured as described in the present embodiment, the virtual diode adapted to provide improved dielectric breakdown voltage of the insulating layer 17 is formed by annexing the second conductivity type semiconductor insulating layer 19 to the insulating layer 17. That is, the virtual diode is formed by using the junction relationship between the insulating layer 17 and second conductivity type semiconductor insulating layer 19. This makes it possible to form the virtual diode by simply adding the second conductivity type semiconductor insulating layer 19 to the related-art configuration, thus keeping the complication of the LED configuration to a minimum.

Third Embodiment

A description will be given next of a third embodiment of the LED is applied. It should be noted that the differences between the present embodiment and the first or second embodiment described earlier will be mainly described here.

[Rough Configuration of the Light-Emitting Element]

Figure 5:
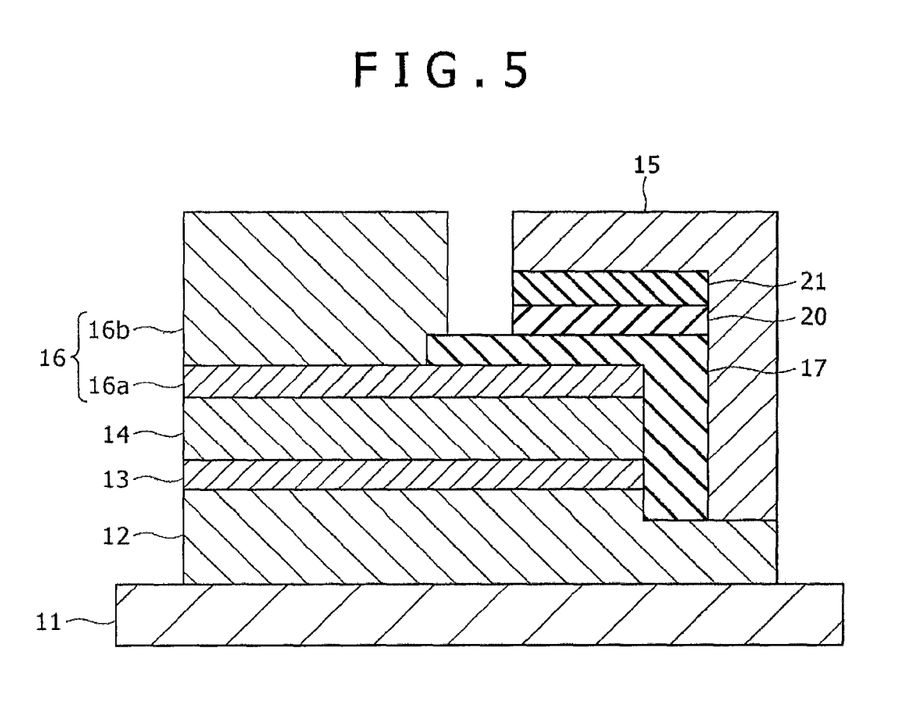
FIG. 5 is a side sectional view diagrammatically illustrating the rough configuration of the LED according to a third embodiment.

FIG. 5 is a side sectional view diagrammatically illustrating the rough configuration of the LED according to the third embodiment.

The LED illustrated in this example includes a pair of insulating layers or first and second conductivity type semiconductor insulating layers 20 and 21 rather than the first conductivity type semiconductor insulating layer 18 described in the first embodiment and the second conductivity type semiconductor insulating layer 19 described in the second embodiment.

This insulating layer pair is annexed to the side of the insulating layer 17 facing the first conductivity type electrode 15. One of the pair, or the first conductivity type semiconductor insulating layer 20, is provided to face the insulating layer 17. The other of the pair, or the second conductivity type semiconductor insulating layer 21, is provided to face the first conductivity type electrode 15. That is, the insulating layer pair made up of the first and second conductivity type semiconductor insulating layers 20 and 21 laminated one on top of the other is disposed to lie between the insulating layer 17 and first conductivity type electrode 15.

The insulating layer pair lies at least over a region equivalent to the portion of the first conductivity type electrode 15 overlapping the insulating layer 17 as illustrated in FIG. 5. However, this region is not limited to the above. The first and second conductivity type semiconductor insulating layers 20 and 21 may be spread to bend around the edge of the insulating layer 17 so as to lie across the boundary between the insulating layer 17 and first conductivity type electrode 15.

Among materials used to form the first and second conductivity type semiconductor insulating layers 20 and 21 are any one of Si, Ge and C, or a combination of any one of B, Al, Ga, In and Ti and any one of N, P, As, Sb and Bi, or a combination of either Zn or Cd and any one of O, S, Se and Te, all with a controlled conductivity type. Here, the term "controlled conductivity type" refers to selection of materials so as to provide the desired conductivity type. More specifically, the first and second conductivity type semiconductor insulating layers 20 and 21 are n-type doped, for example, if B, Al, Ga, In, Zn or Cd is used. On the other hand, the same layers 20 and 21 are p-type doped, for example, if N, P, As, Sb, O, S, Se or Te is used.

As a result of the mediation of the insulating layer pair made up of the first and second conductivity type semiconductor insulating layers 20 and 21 laminated one on top of the other, a virtual diode is formed between the insulating layer 17 and first conductivity type electrode 15. That is, the first and second conductivity type semiconductor insulating layers 20 and 21 form a virtual diode thanks to a reverse p-n junction formed by the lamination of these layers. It should be noted that the virtual diode has rectifying action in the opposite direction to that of a diode which includes the laminated body made up of the first conductivity type semiconductor layer 12, light-emitting functional layer 13 and second conductivity type semiconductor layer 14.

[Manufacturing Steps of the Light-Emitting Element]

A description will be given next of the manufacturing steps of the LED configured as described above.

Figure 6A:
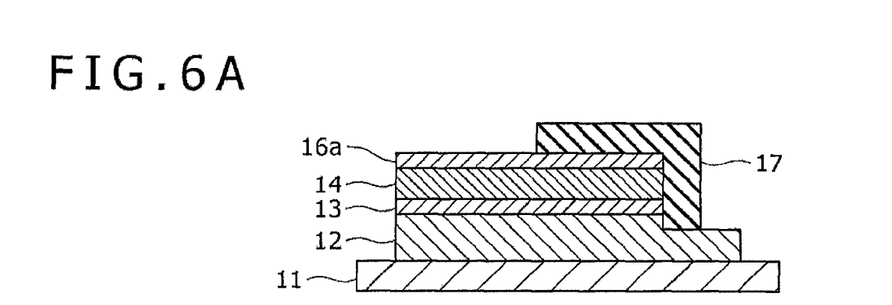
FIGS. 6A to 6C are side sectional views diagrammatically illustrating the manufacturing steps of the LED according to the third embodiment.
Figure 6B:
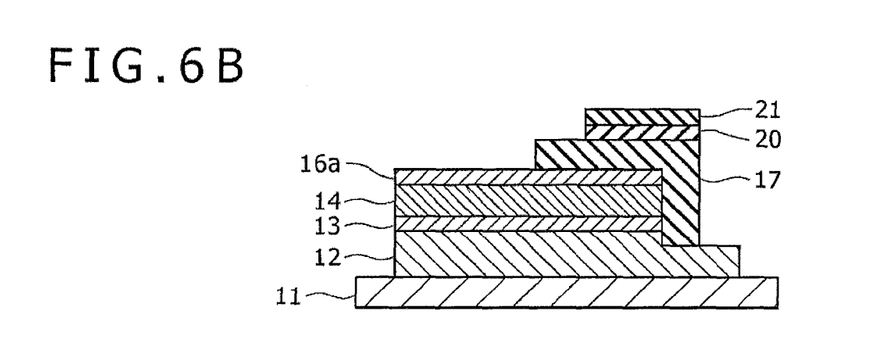
Figure 6C:
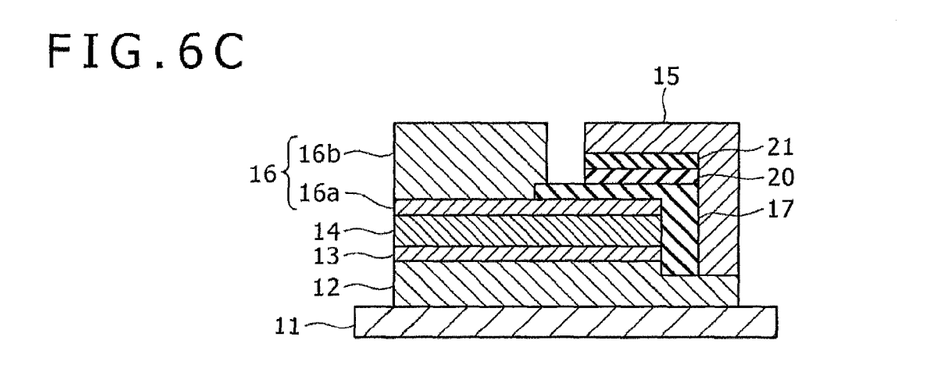

FIGS. 6A to 6C are side sectional views diagrammatically illustrating the manufacturing steps of the LED according to the third embodiment.

In order to manufacture the LED, the first conductivity type semiconductor layer 12, light-emitting functional layer 13 and second conductivity type semiconductor layer 14 and second conductivity type first electrode 16a are formed in this order on the substrate 11 as illustrated in FIG. 6A. The manufacturing steps up to this point are exactly the same as those in the first embodiment.

After the formation of the second conductivity type first electrode 16a, the insulating layer 17 is formed to cover the predetermined partial region of the upper surface of the second conductivity type first electrode 16a and the predetermined partial region of the exposed portion of the first conductivity type semiconductor layer 12. The insulating layer 17 need only be formed in the same manner as in the first embodiment.

After the formation of the insulating layer 17, the first conductivity type semiconductor insulating layer 20 is formed on the predetermined partial region of the upper surface of the insulating layer 17 as illustrated in FIG. 6B. Further, the second conductivity type semiconductor insulating layer 21 is formed on top of the first conductivity type semiconductor insulating layer 20. Among methods used to form the first and second conductivity type semiconductor insulating layers 20 and 21 are plasma CVD, sputtering, MOCVD and MBE.

After the formation of the insulating layer pair or the first and second conductivity type semiconductor insulating layers 20 and 21, the second conductivity type second electrode 16b is formed on the region of the second conductivity type first electrode 16a where the insulating layer 17 is not formed as illustrated in FIG. 6C. The second conductivity type second electrode 16b need only be formed in the same manner as in the first embodiment.

Further, the first conductivity type electrode 15 is formed in such a manner as to not only overlap the insulating layer pair or the first and second conductivity type semiconductor insulating layers 20 and 21 formed on top of the insulating layer 17 but also have continuity with the exposed portion of the first conductivity type semiconductor layer 12. The first conductivity type electrode 15 need only be formed in the same manner as in the first embodiment.

It should be noted that either of the steps of partially exposing the first conductivity type semiconductor layer 12 and forming the second conductivity type second electrode 16b may be performed before the other. Alternatively, the two steps may be performed simultaneously. Still alternatively, the second conductivity type second electrode 16b may be formed prior to forming the insulating layer pair or the first and second conductivity type semiconductor insulating layers 20 and 21.

The LED configured as shown in FIG. 5 is manufactured by the steps described above.

[Operation of the Light-Emitting Element]

A description will be given next of the operation adapted to cause the LED configured as described above to emit light.

In order to cause the LED configured as described above to emit light, a forward voltage is applied from the second conductivity type electrode 16 to the first conductivity type electrode 15. The second conductivity type electrode 16 has continuity with the second conductivity type semiconductor layer 14 and functions as an anode. The first conductivity type electrode 15 has continuity with the first conductivity type semiconductor layer 12 and functions as a cathode. This injects a current into the p-n junction structure formed by the laminated body which includes the first conductivity type semiconductor layer 12, light-emitting functional layer 13 and second conductivity type semiconductor layer 14. The quantum well structure of the light-emitting functional layer 13 is excited by the injection of a current, causing the entire surface of the laminated body including the light-emitting functional layer 13 to emit light.

It should be noted, however, that the insulating layer pair, made up of the first and second conductivity type semiconductor insulating layers 20 and 21, is annexed to the insulating layer 17. As a result of the annexing of this insulating layer pair, a virtual diode is formed which has rectifying action in the opposite direction to that of the diode having a p-n junction structure formed by the laminated body. The laminated body includes the first conductivity type semiconductor layer 12, light-emitting functional layer 13 and second conductivity type semiconductor layer 14.

Therefore, when the diode having a p-n junction is forward-biased by applying a forward voltage from the anode to the cathode, the virtual diode formed between the insulating layer 17 and first conductivity type electrode 15 is reverse-biased. That is, current flow is difficult to take place in the insulating layer 17 if a reverse bias condition is produced as a result of the annexing of the insulating layer pair made up of the first and second conductivity type semiconductor insulating layers 20 and 21. This provides improved dielectric breakdown voltage of the insulating layer 17 without thickening the same layer 17.

Thus, the LED configured as described in the present embodiment also offers excellent ESD resistance thanks to the dielectric breakdown voltage of the insulating layer 17. That is, sufficient ESD resistance can be secured without entailing problems including reduced light intensity and upsizing of the element as a whole as with the first or second embodiment.

Moreover, in the LED configured as described in the present embodiment, the virtual diode adapted to provide improved dielectric breakdown voltage of the insulating layer 17 is formed by a reverse p-n junction of the first and second conductivity type semiconductor insulating layers 20 and 21 laminated one on top of the other. This makes it possible to form the virtual diode independently, for example, of the relationship with the material used to form the insulating layer 17, thus providing a sufficient degree of freedom in the selection of materials.

It should be noted that although preferred specific examples of the present invention have been described in the first to third embodiments, the present application is not limited to these examples.

For example, although a substrate-side light extraction LED was taken as an example in the first to third embodiments, the present application is applicable in exactly the same manner even to an LED devoid of the substrate serving as a light extraction surface.

For example, although a substrate-side light extraction LED was taken as an example in the first to third embodiments, the present invention is applicable in exactly the same manner even to an electrode transmitted light extraction LED.

Still further, although a case was taken as an example in which the present invention was applied to an LED which is an example of a light-emitting element in the first to third examples, the present application is applicable in exactly the same manner even to a semiconductor laser or other light-emitting element.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A light-emitting element comprising:
    a first conductivity type semiconductor layer;
    a light-emitting functional layer formed on the first conductivity type semiconductor layer in such a manner that part of the first conductivity type semiconductor layer is exposed;
    a second conductivity type semiconductor layer formed on the light-emitting functional layer;
    a first conductivity type electrode which has continuity with the exposed portion of the first conductivity type semiconductor layer;
    a second conductivity type electrode which has continuity with the second conductivity type semiconductor layer;
    an insulating layer having a first portion that extends upward from the first conductivity type semiconductor layer and a second portion that extends to one side so as to be formed over at least a portion of the second conductivity type electrode, the first portion of the insulating layer being sandwiched directly between the light-emitting functional layer, second conductivity type semiconductor layer and second conductivity type electrode on one side and between the first conductivity type electrode on the opposite side for purposes of insulation; and
    an annex insulating layer formed of a different material than that of the insulating layer, the annex insulating layer annexed to and directly contacting the insulating layer to form a virtual diode having rectifying action in the opposite direction to that of a diode made up of the second conductivity type semiconductor layer, light-emitting functional layer and first conductivity type semiconductor layer,
    wherein a portion of the second conductivity type electrode is formed between the annex insulating layer and the second conductivity type semiconductor layer, and the annex insulating layer is formed between and surrounded by portions of the insulating layer and the second conductivity type electrode.

2. The light-emitting element of claim 1, wherein the annex insulating layer is annexed to the side of the insulating layer facing the second conductivity type electrode and includes a first conductivity type semiconductor insulating layer adapted to form the virtual diode using a reverse p-n junction between the insulating layer and annex insulating layer.

3. The light-emitting element of claim 1, wherein the annex insulating layer is annexed to the side of the insulating layer facing the second conductivity type electrode and includes a first conductivity type semiconductor insulating layer adapted to form the virtual diode using Schottky junction between the insulating layer and annex insulating layer.

4. The light-emitting element of claim 1, wherein the annex insulating layer is annexed to the side of the insulating layer facing the first conductivity type electrode and includes a second conductivity type semiconductor insulating layer adapted to form the virtual diode using a reverse p-n junction between the insulating layer and annex insulating layer.

5. The light-emitting element of claim 1, wherein the annex insulating layer is annexed to the side of the insulating layer facing the first conductivity type electrode and includes a second conductivity type semiconductor insulating layer adapted to faun the virtual diode using Schottky junction between the insulating layer and annex insulating layer.

6. The light-emitting element of claim 1, wherein the annex insulating layer includes a pair of first and second conductivity type semiconductor insulating layers adapted to form the virtual diode using a reverse p-n junction.

7. The light-emitting element of claim 1, wherein the annex insulating layer is made of any one of Si, Ge and C, all with a controlled conductivity type.

8. The light-emitting element of claim 1, wherein
the annex insulating layer is made of a combination of any one of B, Al, Ga, In and Ti and any one of N, P, As, Sb and Bi, all with a controlled conductivity type.

9. The light-emitting element of claim 1, wherein
the annex insulating layer is made of a combination of either Zn or Cd and any one of O, S, Se and Te, all with a controlled conductivity type.

10. The light-emitting element of claim 1, wherein
the first conductivity type semiconductor layer is formed on the substrate.

11. The light-emitting element of claim 1, wherein the first conductivity type electrode extends upward from the first conductivity type semiconductor layer and then extends to one side so as to be formed over at least a portion of the first conductivity type semiconductor layer other than the exposed portion.

12. The light-emitting element of claim 11, wherein an upper surface area of the first conductivity type electrode is greater than a lower surface area of the first conductivity type electrode that is in contact with the first conductivity type semiconductor layer.

13. The light-emitting element of claim 1, wherein the second conductivity type electrode includes a first electrode layer laminated on a second electrode layer, the second electrode layer being formed on the second conductivity type semiconductor layer and configured as an optical reflecting film.

14. The light-emitting element of claim 13, wherein the annex insulating layer is formed over at least a portion of the second electrode layer.

15. The light-emitting element of claim 1, wherein the first conductivity type electrode does not contact the second conductivity type electrode.

* * * * *